United States Patent
Friedrichs et al.

(10) Patent No.: US 6,693,322 B2
(45) Date of Patent: Feb. 17, 2004

(54) SEMICONDUCTOR CONSTRUCTION WITH BURIED ISLAND REGION AND CONTACT REGION

(75) Inventors: Peter Friedrichs, Nürnberg (DE); Heinz Mitlehner, Uttenreuth (DE); Reinhold Schörner, Grossenseebach (DE)

(73) Assignee: SiCED Electronics Development GmbH & Co. KG, Erlangen (DE)

( * ) Notice: Subject to any disclaimer, the term of this patent is extended or adjusted under 35 U.S.C. 154(b) by 0 days.

(21) Appl. No.: 10/352,731

(22) Filed: Jan. 27, 2003

(65) Prior Publication Data

US 2003/0137010 A1 Jul. 24, 2003

Related U.S. Application Data

(63) Continuation of application No. PCT/DE01/02640, filed on Jul. 13, 2001.

(30) Foreign Application Priority Data

Jul. 25, 2000 (DE) .......................... 100 36 208

(51) Int. Cl.[7] .............................................. H01L 29/76
(52) U.S. Cl. ..................... 257/330; 257/329; 257/334; 257/77
(58) Field of Search ........................... 257/77, 329, 330, 257/332, 334

(56) References Cited

U.S. PATENT DOCUMENTS

| | | | |
|---|---|---|---|
| 4,805,003 A | 2/1989 | Holm et al. | .................. 257/192 |
| 5,418,376 A * | 5/1995 | Muraoka et al. | ............. 257/136 |
| 5,543,637 A | 8/1996 | Baliga | |
| 5,895,939 A | 4/1999 | Ueno | |
| 5,963,807 A | 10/1999 | Ueno | |
| 6,034,385 A | 3/2000 | Stephani et al. | |
| 2001/0001484 A1 * | 5/2001 | Friedrichs et al. | ............. 257/77 |

FOREIGN PATENT DOCUMENTS

| | | |
|---|---|---|
| DE | 196 29 088 A1 | 1/1997 |
| DE | 196 10 135 C1 | 6/1997 |
| EP | 0 703 629 A2 | 3/1996 |
| EP | 0 822 600 A1 | 2/1998 |
| WO | 98/19342 | 5/1998 |
| WO | 99/07011 | 2/1999 |
| WO | 00/03440 | 1/2000 |
| WO | 00/16403 | 3/2000 |

* cited by examiner

Primary Examiner—Allan R. Wilson
(74) Attorney, Agent, or Firm—Laurence A. Greenberg; Werner H. Stemer; Gregory L. Mayback

(57) ABSTRACT

A semiconductor configuration for current control has an n-type first semiconductor region with a first surface, a p-type covered island region, within the first semiconductor region, with a second surface, an n-type contact region arranged on the second surface within the island region and a lateral channel region, formed between the first and second surface as part of the first semiconductor region. The channel is part of a current path from or to the contact region. The current within the lateral channel region may be influenced by at least one depletion zone. A lateral edge of the lateral channel region extends as far as the contact region.

18 Claims, 3 Drawing Sheets

SEMICONDUCTOR CONSTRUCTION WITH BURIED ISLAND REGION AND CONTACT REGION

CROSS-REFERENCE TO RELATED APPLICATION

This application is a continuation of International Application No. PCT/DE01/02640, filed Jul. 13, 2001, which designated the United States and which was not published in English.

BACKGROUND OF THE INVENTION

Field of the Invention

The invention lies in the semiconductor technology field. More specifically, the invention relates to a semiconductor construction for controlling a current flow. The semiconductor construction according to the invention comprises, in particular, an island region, which is at least partly buried in a first semiconductor region.

In order to supply an electrical load with a rated electric current, the load is usually connected to an electrical supply network via a switching device. During the switch-on operation and also in the case of a short circuit, an overcurrent occurs which lies significantly above the rated current. In order to protect the electrical load, the switching device connected between the load and the electrical network must be able to limit and also switch off the overcurrent. Current-limiting switches in the form of a semiconductor construction are known for this function.

U.S. Pat. No. 6,034,385 and international publication WO 00/16403 A1 disclose such a semiconductor construction, in which a current flow between a first and a second electrode is controlled. In particular, the current is switched on and off or limited to a maximum value. The active part of the semiconductor construction comprises a first semiconductor region of a predetermined conductivity type, in particular the n conductivity type. For current control, at least one lateral channel region is provided within the first semiconductor region. In this case, lateral is understood to mean a direction parallel to a surface of the first semiconductor region. By contrast, vertical denotes a direction running perpendicularly to the surface. The lateral channel region is bounded by at least one p-n junction, in particular by the depletion zone (zone with depletion of charge carriers and hence high electrical resistance; space charge zone) of the p-n junction, in the vertical direction. The vertical extent of the depletion zone can be set inter alia by a control voltage. The p-n junction is formed between the first semiconductor region and a buried p-conducting island region. The buried island region undertakes the shielding of the first electrode with respect to the high electric field in the reverse direction or in the switched-off state. In specific embodiments, the channel region can also be bounded by a further depletion zone in the vertical direction. The further depletion zone is brought about, by way of example, by a further p-n junction between a second p-conducting semiconductor region and the first n-conducting semiconductor region. Depending on the embodiment, a relatively high forward resistance can result in the case of the prior semiconductor construction. Moreover, for the exact setting of the lateral dimension of the channel region and also for the precise lateral positioning of the channel region within the semiconductor construction, the individual semiconductor regions have to be positioned very exactly relative to one another. This high alignment outlay is necessary in particular for the buried p-conducting island region and the second p-conducting semiconductor region.

A similar semiconductor construction is described in U.S. Pat. Nos. 5,895,939 and 5,963,807 and German patent application DE 196 29 088 A1. Consequently, this semiconductor construction also has a relatively high forward resistance, and it is again necessary to satisfy high requirements made of the alignment accuracy.

Furthermore, U.S. Pat. No. 5,543,637 discloses a semiconductor construction which comprises a first semiconductor region of a first conductivity type with a buried island region of a conductivity type opposite to the first, and also two electrodes and a control electrode. The respective depletion zones brought about by the control electrode and the buried island region again form a channel region in which a current flowing between the two electrodes is controlled. The control electrode is embodied either as a Schottky contact or as an MOS contact. 3C, 6H or 4H silicon carbide is used as semiconductor material. This semiconductor construction also has a relatively high forward resistance and requires a high precision in the alignment of the individual semiconductor regions.

SUMMARY OF THE INVENTION

It is accordingly an object of the invention to provide a semiconductor construction with a buried island and a contact region which overcomes the above-mentioned disadvantages of the heretofore-known devices and methods of this general type and which specifies a semiconductor construction for current control which has a low forward resistance. At the same time, the intention is to improve the alignment outlay required for the local definition of the channel region by comparison with the prior art.

With the foregoing and other objects in view there is provided, in accordance with the invention, a semiconductor construction for controlling a current, comprising:

a first semiconductor region of a first conductivity type having a first surface;

an island region of a second conductivity type, opposite the first conductivity type, at least partly buried within the first semiconductor region and having a second surface facing the first surface;

a contact region of the first conductivity type disposed at the second surface within the island region; and a lateral channel region formed between the first surface and the second surface and forming a part of the first semiconductor region;

the channel region forming a part of a current path from or to the contact region;

at least one depletion zone for influencing a current within the channel region; and the channel region having one lateral edge reaching to the contact region.

Expressed in different terms, the novel semiconductor construction is a configuration for controlling a current and it is formed of the following elements:

a) a first semiconductor region of a first conductivity type (n or p) having a first surface, b) an island region of a second conductivity type (p or n), opposite to the first conductivity type, which is at least partly buried within the first semiconductor region and has a second surface facing the first surface, c) a contact region of the first conductivity type (n or p), which is arranged at the second surface within the island region, and d) a lateral channel region formed between first and second surfaces as part of the first semiconductor region, d1) which channel region is part of a current path from or to the contact region, d2) within which channel region the current can be influenced by at least one depletion zone, and d3) one lateral edge of which channel region reaches as far as the contact region.

In this case, the invention is based on the insight that the relatively high forward resistance that can be observed in the case of the known semiconductor construction is brought about in particular by a so-called prechannel. This prechannel is situated between the actual lateral channel region and the contact region within the first semiconductor region. Since the first semiconductor region usually has to take up a large part of the voltage arising in the reverse direction or in the switched-off state, it normally has a relatively low doping rate. However, this results in a comparatively low electrical conductivity. The electric current carried in the forward state therefore experiences an electrical resistance that is all the greater, the longer its current path through the first semiconductor region. By virtue of the arrangement of the contact region within the buried island region, an electric current flowing out of the contact region directly enters into the lateral channel region which is critical for the current control. A prechannel, which is insignificant for the actual current control and would otherwise lead to an undesirable increase in the forward resistance, does not arise in the case of this particular arrangement of the contact region. Thus, the overall resultant forward resistance is significantly less than that of the known semiconductor construction.

Both in terms of lateral dimensioning and in terms of its lateral position within the semiconductor construction, the lateral channel region is essentially determined by the position of the contact region within the buried island region. It has been recognized that the structuring method disclosed in international publication WO 99/07011 A1, that was originally designed for a MOSFET, can also advantageously be used for the definition of the lateral channel region of the semiconductor construction. In this case, what has a favorable effect is, in particular, the fact that the channel region and the island region, which determine the dimensioning and the position of the lateral channel region, are arranged in the same epitaxial layer. By contrast, in the case of the known semiconductor construction, the structures defining the lateral channel region are situated in at least two different epitaxial layers. This means that, between two lithography steps required for the structure definition, an epitaxial growth, in particular, can take place, thereby making it considerably more difficult to align the lithography steps with high accuracy in relation to one another. By virtue of the contact region being embedded in the island region, the structuring that is essential for the lateral channel region in the semiconductor construction takes place within a single epitaxial layer and thus both with a lower outlay and with a very high precision.

In accordance with an advantageous embodiment, the island region and the contact region are short-circuited by means of a first electrode. To that end, a contact hole which extends proceeding from the first surface at least as far as the second surface is provided in the first semiconductor region.

It is also possible for there to be a plurality of contact holes present, in order to ensure a more reliable contact-connection. In this case, the at least one contact hole is positioned in such a way that a part for a contact-connection is in each case accessible both from the island region and from the contact region. The first electrode provided in the at least one contact hole effects ohmic contact-connection of the two regions. By virtue of the electrically conductive connection (=short circuit) between the contact region and the island region, a capacitance that otherwise forms between these two regions is practically eliminated or at least reduced to a very great extent. As a result, the semiconductor construction can be used as a very fast switch.

In accordance with an additional feature of the invention, the island region has an elevation in the region adjoining the lateral channel region. Said elevation can be achieved for example by a short deep etching of the contact region and also of the island region in the region not adjoining the lateral channel region. The operational reliability of the semiconductor construction increases by virtue of the fact that the second surface is set back in the region of the contact region relative to that region of the island region which adjoins the channel region. The lateral channel region is then reliably pinched off by the participating depletion zones before a possible punch-through to the contact region can occur.

In accordance with another feature of the invention, the lateral channel region is arranged between a first and a second depletion zone in the vertical direction. The first depletion zone is situated on a side of the lateral channel region which faces the first surface and the second depletion zone is situated on that side of the lateral channel region which faces the island region. The second depletion zone is formed by a p-n junction between the first semiconductor region and the buried island region. Depending on the operating state of the semiconductor construction, the two depletion zones bound the lateral channel region or pinch it off completely. A lateral channel region designed in this way yields a semiconductor construction that is highly resistant to a breakdown.

Moreover, preference is attached to an embodiment in which the first depletion zone and the contact region overlap in a fictitious projection—performed perpendicularly to the first or second surface—into a common plane at their lateral edges. The lateral channel region then reaches directly up to the contact region embedded in the island region. A prechannel, which cannot be controlled by the depletion zones and would increase the forward resistance, does not form in that case.

In one embodiment, the first depletion zone is that of a Schottky contact. In this case, the Schottky contact may, in particular, also be formed by means of the first electrode and a region of the first semiconductor region which is located at the first surface. The first electrode then extends over the upper edge of the contact hole as far as the relevant region of the first surface. However, the Schottky contact may also be formed by an additional control electrode, to which a control voltage can be applied, and that region of the first semiconductor region which is located at the first surface. In this case, the first electrode and the control electrode are electrically insulated from one another. The first semiconductor region may have, in the region of the Schottky contact, a suitable doping that deviates from the rest of the first semiconductor region.

In another embodiment, the lateral channel region is bounded or pinched off by at least one first depletion zone brought about by a MIS (Metal Isolator Semiconductor) contact, in particular by a MOS (Metal Oxide Semiconductor) contact. In this case, a MIS contact is understood to be a layer construction comprising an insulation layer and an overlying control electrode, said layer construction being arranged at the first surface of the semiconductor region. The insulation layer is preferably an oxide layer.

In a particularly advantageous refinement, the first depletion zone, which bounds the lateral channel region in the vertical direction, is the depletion zone of a p-n junction situated between the first semiconductor and a second semiconductor region. The second semiconductor region is arranged at the first surface within the first semiconductor region. It has the opposite conductivity type to the conductivity type of the first semiconductor region.

A first variant of the refinement with the second semiconductor region is distinguished by the fact that a charge storage effect is utilized in the second semiconductor region. This is achieved by electrical insulation of the second semiconductor region at the first surface with an insulation layer, preferably with an oxide layer. The charge storage in the second semiconductor region has the effect that after the onset of the pinch-off of the channel region in the presence of a specific operating voltage, the pinch-off initially persists even when the operating voltage decreases. As a result, an acceptable limiting current (reverse current) is essentially maintained over a predetermined limiting time (blocking time). This variant makes it possible to realize a passive current limiter in which the lateral channel region is normally open and is pinched off only by a voltage drop brought about by a large current.

In a second variant, the second semiconductor region is subjected to ohmic contact-connection to a control electrode. By applying a control voltage to said control electrode, it is possible to control the extent of the first depletion zone and thus the electrical resistance of the lateral channel region. In this second variant, the channel region can also already be pinched off in the voltage-free state (=normally off) and be opened, i.e. produced, only by application of a control voltage. This controllable semiconductor construction makes it possible to realize an active current limiter.

The first electrode and the control electrode can be electrically insulated from one another. On the other hand, it is also possible to effect ohmic contact-connection also of the second semiconductor region at the first surface by means of the first electrode, besides the contact region and the island region. The contact region is then also electrically short-circuited to the second semiconductor region. The first electrode and the control electrode form a common electrode in this case.

In an advantageous refinement, the semiconductor construction is composed partially or else completely of a semiconductor material having a band gap of at least 2 eV. A semiconductor material with such a high band gap is advantageous particularly if a charge storage effect is utilized. Examples of suitable semiconductor materials are diamond (diamant), gallium nitride (GaN), indium phosphite (InP) or preferably silicon carbide (SiC). The above-mentioned semiconductor materials, in particular SiC, are very advantageous on account of the extremely low intrinsic charge carrier concentration (=charge carrier concentration without doping) and the very low on-state loss. The low intrinsic charge carrier concentration promotes charge storage. Moreover, the abovementioned semiconductor materials have a significantly higher breakdown strength compared with the "universal semiconductor" silicon, so that the semiconductor construction can be used at a higher voltage. The preferred semiconductor material is silicon carbide, in particular monocrystalline silicon carbide of the 3C or 4H or 6H or 15R polytype.

A favorable refinement is a refinement in which an additional p-n junction is provided between the first semiconductor region and a second electrode, which, in particular is arranged on a side of the first semiconductor region which is opposite to the first surface. By virtue of this additional p-n junction, the semiconductor construction can be operated at a higher (reverse) voltage.

Other features which are considered as characteristic for the invention are set forth in the appended claims.

Although the invention is illustrated and described herein as embodied in a semiconductor construction with buried island region and contact region, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
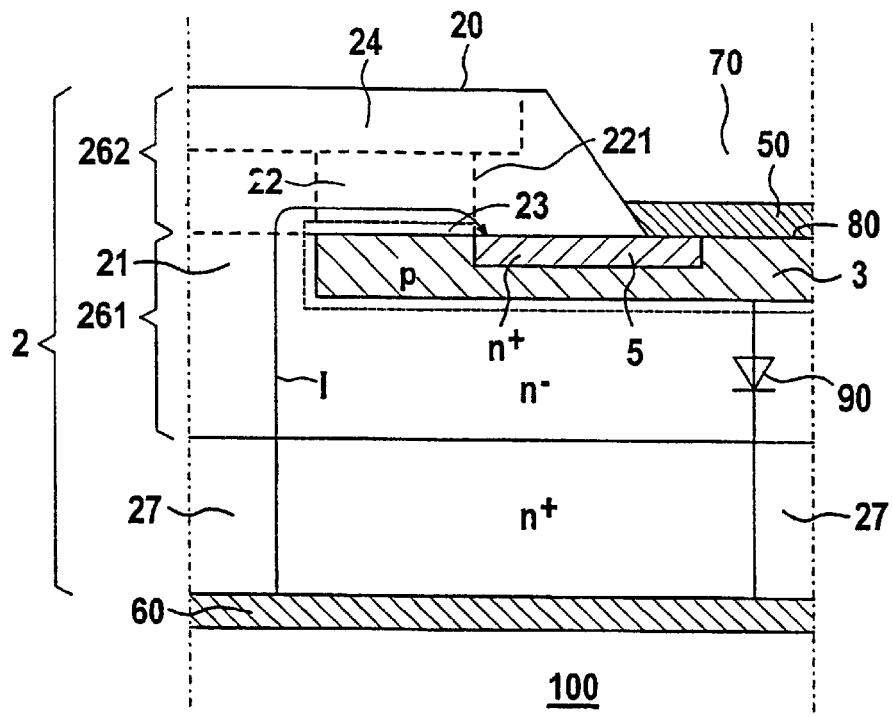
FIG. 1 is a partly schematic sectional view of a semiconductor construction according to the invention with a contact region arranged within a buried island region and with a lateral channel region.

Referring now to the figures of the drawing in detail and first, particularly, to FIG. 1 thereof, there is shown a semiconductor construction 100 for controlling a current I in the form of a vertical junction field-effect transistor (JFET). The semiconductor device shown in FIG. 1 is merely a half-cell. Mirroring at the right-hand edge of the half-cell yields a complete cell. A multicell structure, accordingly, is produced by multiple mirroring.

The active part, in which the current control essentially takes place, is contained in an n-conducting (electron conduction) first semiconductor region 2. Arranged within the first semiconductor region 2 is a p-conducting (hole conduction) buried island region 3. The first semiconductor region 2 has a first surface 20 and the buried island region 3 has a second surface 80. The two surfaces 20 and 80 run substantially parallel to one another. In the exemplary embodiment of FIG. 1, the first semiconductor region 2 is composed of a substrate 27 and two epitaxially grown semiconductor layers 261 and 262 arranged thereon. The first and second semiconductor layers 261 and 262, respectively, are more lightly doped ($n^-$) than the substrate 27 ($n^+$).

An n-conducting contact region 5 embedded within the island region 3 is provided at the second surface 80. It is more highly doped ($n^+$) than the two semiconductor layers 261 and 262. The island region 3 extends further than the contact region 5 in all directions parallel to the first surface 20.

Silicon carbide is used as the semiconductor material in the semiconductor construction 100. It is particularly well suited, in particular at high voltages, on account of its specific material properties. Preferred dopants are boron and aluminum for a p-doping and nitrogen and phosphorus for an n-doping. The dopant concentration of the contact region 5 typically lies between $1\times10^{19}$ cm$^{-3}$ and $1\times10^{20}$ cm$^{-3}$ and that of the first semiconductor region 2 is typically a maximum of $2\times10^{16}$ cm$^{-3}$ (The symbol "×" is used as a multiplication symbol).

The buried island region 3 and the contact region 5 embedded therein are preferably fabricated after the application of the first semiconductor layer 261. In this case, it is possible to employ in particular the self-aligning masking technique described in international publication WO 99/07011 A1. The island region 3 and the contact region 5 are accordingly produced by way of two masking steps and a corresponding ion implantation of n-type and p-type dopant particles into the second surface 80. Afterward, the second semiconductor layer 262 is applied in a second epitaxial growth step. With the (self-aligning) fabrication of the buried island region 3 and of the contact region 5, all the process steps with a stringent requirement placed on the alignment accuracy are already processed in a relatively early stage of the fabrication process. All the subsequent process steps are noncritical in this regard.

A contact hole 70 is provided within the second semiconductor layer 262, which contact hole extends in the vertical direction as far as the second surface 80 of the buried island region 3. The contact hole 70 uncovers both a part of the buried island region 3 and a part of the contact region 5, so that the two regions 3 and 5 can be subjected to ohmic contact-connection by means of a first electrode 50 made of an electrically conductive material. The contact region 5 and the island region 3 are short-circuited by the first electrode 50. Polysilicon or a metal, preferably nickel, aluminum, tantalum, titanium or tungsten, is appropriate as material for the first electrode 50. The contact hole 70 is fabricated by means of a dry etching process, for example. In order to compensate for fluctuations in the etching depth, in accordance with an embodiment that is not illustrated, it is also possible to provide a plurality of contact holes 70, which then each have a smaller diameter.

A second electrode 60 is provided on a side of the first semiconductor region 2 which is remote from the first surface 20. The current I flowing through the semiconductor construction 100 is conducted in and away by means of the two electrodes 50 and 60. On account of the essentially vertical current flow, i.e. current flow directed perpendicular to the first surface 20, the semiconductor construction 100 is also referred to as vertical.

A first depletion zone 24 is arranged laterally beside the contact hole 70. The first depletion zone 24 adjoins the first surface 20 and is situated within the first semiconductor region 2. Furthermore, there is a p-n junction present between the first semiconductor region 2 and the buried island region 3, the depletion zone of which p-n junction is designated here as second depletion zone 23. The second depletion zone 23 surrounds the entire buried island region 3. Insofar as the two depletion zones 23 and 24 extend within the first semiconductor region 2, they are depicted by dashed lines in FIG. 1. The first and second depletion zones 24 and 23, respectively, bound a lateral channel region 22 in the vertical direction, which channel region lies within the first semiconductor region 2 and is part of the current path between the first and second electrodes 50 and 60, respectively. The first depletion zone 24 and the buried island region 3 are arranged in such a way that the two depletion zones 23 and 24 overlap at their lateral edges in a projection onto the first surface 20. The lateral channel region 22 is situated precisely within this overlap region.

In the lateral direction, the lateral channel region 22 is bounded by an edge 221 on the side facing the contact area 70. Said edge 221 is formed by a projection of the contact region 5 into the first semiconductor region 2, which projection is performed perpendicularly to the first or second surface 20 or 80, respectively. Specifically, the second depletion zone 23 serving as lower vertical boundary no longer extends into the first semiconductor region 2 starting from the location at which the heavily n-doped contact region 5 is arranged within the island region 3. The p-n junction, which is critical for such a depletion zone, runs starting from this location between the n-conducting contact region 5 and the p-conducting island region 3. The lateral edge 221 is thus determined by the position of the contact region 5 within the island region 3. By contrast, the second lateral edge (not specifically designated in FIG. 1) of the lateral channel region 22 is determined by the lateral dimensioning of the island region 5. These geometric parameters can be established very accurately by the structuring method described in the above-mentioned international publication WO 99/07011 A1. Thus, in the case of the semiconductor construction 100, the length and also the position of the lateral channel region 22 can be set in a highly accurate manner.

Moreover, the lateral bounding of the lateral channel 22 by the contact region 5 has the advantage that the current I enters into the contact region 5 directly after emerging from the lateral channel region 22, without in the process traversing a so-called prechannel within the first semiconductor region 2. As a result, the resistance of such a prechannel is obviated and a low forward resistance results overall.

Moreover, the arrangement of the contact region and the associated obviation of a prechannel lead to a reduced space requirement, thereby enabling a high packing density in an, in particular, multicell semiconductor structure constructed from a large number of half-cells in accordance with the semiconductor construction 100. The reduction of the power loss as a result of the obviation of the prechannel also has a favorable effect with regard to increasing the packing density.

The first depletion zone 24 and the contact region 5 are arranged in such a way in relation to one another that they overlap by 1 to 2 $\mu$m at their lateral edges in a projection into a common plane which is performed perpendicularly to the first or second surface 20 or 80, respectively. This last-mentioned overlap ensures that the lateral edge 221 actually reaches directly as far as the contact region 5 and the advantages described above are established.

The length (=lateral extent) of the lateral channel region 22 is typically between 1 $\mu$m and 5 $\mu$m in the case of a semiconductor construction 100 fabricated from silicon carbide. The lateral channel region 22 is preferably made as short as possible. This results in a highly compact overall construction with a small space requirement. The vertical extent typically lies between 0.1 $\mu$m and 1 $\mu$m in the voltage-free and current-free state. The depletion zones 23 and 24 are characterized by a high degree of depletion of charge carriers and thus have a significantly higher electrical resistance than the lateral channel region 22 bounded by them in the vertical direction. The spatial extent of the two depletion zones 23 and 24, in particular that in the vertical direction, varies in a manner dependent on the prevailing current and voltage conditions.

The lateral channel region 22 thus critically determines the (control) behavior of the entire semiconductor construction 100. When designed as a current limiter, the behavior in the presence of an operating voltage in the forward direction depends on the electric current I flowing through the semiconductor construction 100 between the two electrodes 50 and 60. As the current intensity rises, the forward voltage drop increases between the electrodes 50 and 60 on account of the bulk resistance. This leads to an enlargement of the depletion zones 23 and 24 and, consequently, to a reduction of the current-carrying cross-sectional area in the lateral channel region 22, which reduction is associated with a corresponding increase in resistance. Upon reaching a specific critical current value (=saturation current), the two depletion zones 23 and 24 touch and completely pinch off the lateral channel region 22.

Such a channel pinch-off can also be achieved by applying a corresponding control voltage to the semiconductor construction 100.

The current path between the first and second electrodes 50 and 60, respectively, comprises, in the forward direction, the contact region 5, the lateral channel region 22, a vertical channel region 21 arranged in the first semiconductor region 2, and a subsequent drift zone composed of the remaining part of the first epitaxial layer 261 and the substrate 27.

By contrast, upon application of an operating voltage in the reverse direction, the current flow takes place essentially via a backward diode 90, formed by the buried island region 3 and the underlying part of the first semiconductor region 2. Since the current flow thus takes place essentially via the backward diode 90 and not through the lateral channel region 22, current control by the semiconductor construction 100 is not possible in the reverse direction. When the semiconductor construction 100 is used in a converter, the integrated backward diode 90 can render superfluous the circuitry connecting the semiconductor switch that is used to a freewheeling diode, said circuitry usually being necessary in a converter. For carrying current in the reverse direction, the backward diode 90 offers a large area having current-carrying capability.

Figure 2:
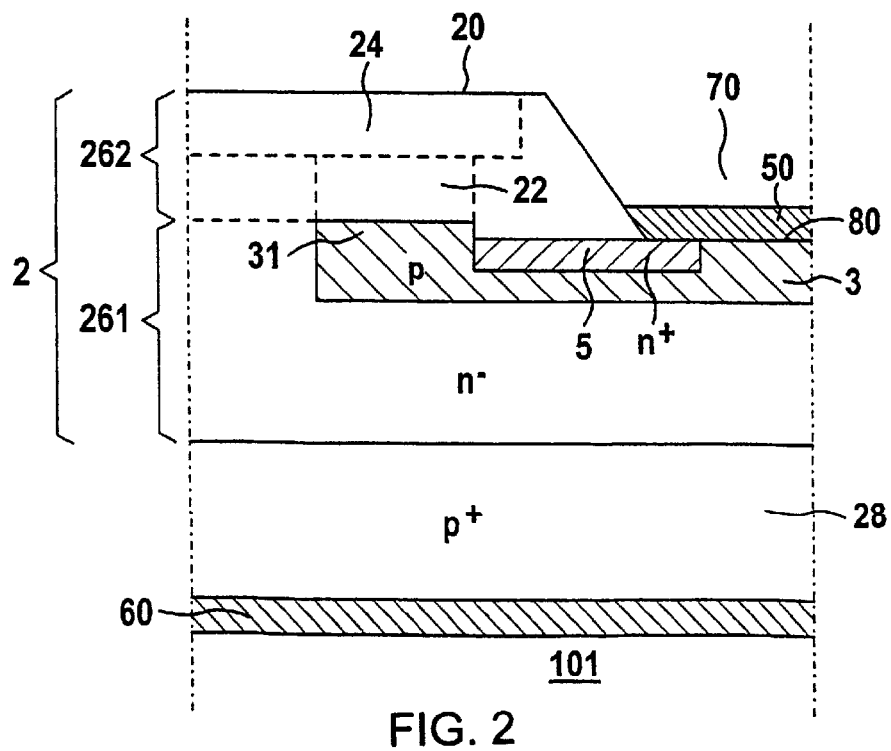
FIG. 2 is a partly schematic sectional view of a semiconductor construction according to the invention with a contact region arranged within a buried island region and with a lateral channel region.

The semiconductor construction 101 shown in FIG. 2 differs from the semiconductor construction 100 merely by the fact that a p-conducting substrate 28 is used instead of the n-conducting substrate 27. The weakly n-conducting first semiconductor region 2, which in this case is composed only of the two semiconductor layers 261 and 262, forms a p-n junction with the heavily p-conducting (p$^+$) substrate 28. This additional p-n junction is favorable particularly in the case of a use at a high voltage, for example at least of the order of magnitude of a few kV.

Moreover, the buried island region 3 has an additional elevation 31 in the region adjoining the lateral channel region 22. The elevation 31 is produced for example by a short deep etching step after the fabrication of the island region 3 and of the embedded contact region 5 and still before the epitaxial growth of the second semiconductor layer 262. The deep etching is effected only in the region of the second surface 80, which does not adjoin the lateral semiconductor region 22, that is to say, in particular, also in the region of the contact region 5. This measure results in a reliable operating behavior. This is because the pinch-off of the lateral channel region 22 by the two depletion zones 23 and 24 is then reliably effected before an undesirable punch-through—otherwise possible in principle—of the depletion zone 24 to the contact region 5. The measure of providing an elevation 31 in the island region 3 can readily also be transferred to the semiconductor construction 100 from FIG. 1.

Figure 3:
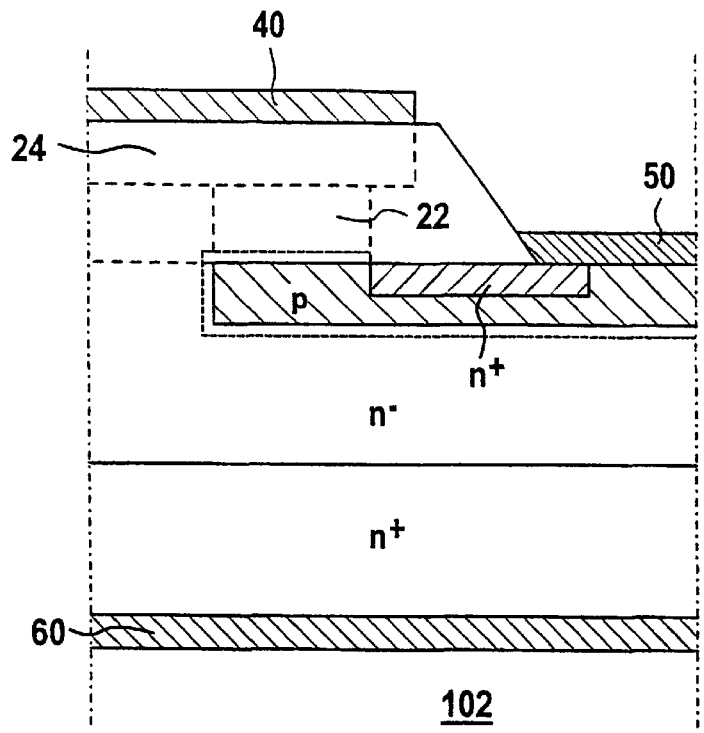
FIGS. 3 to 6 are similar views each showing an exemplary embodiment for the control of the channel region of the semiconductor construction of FIG. 1.
Figure 4:
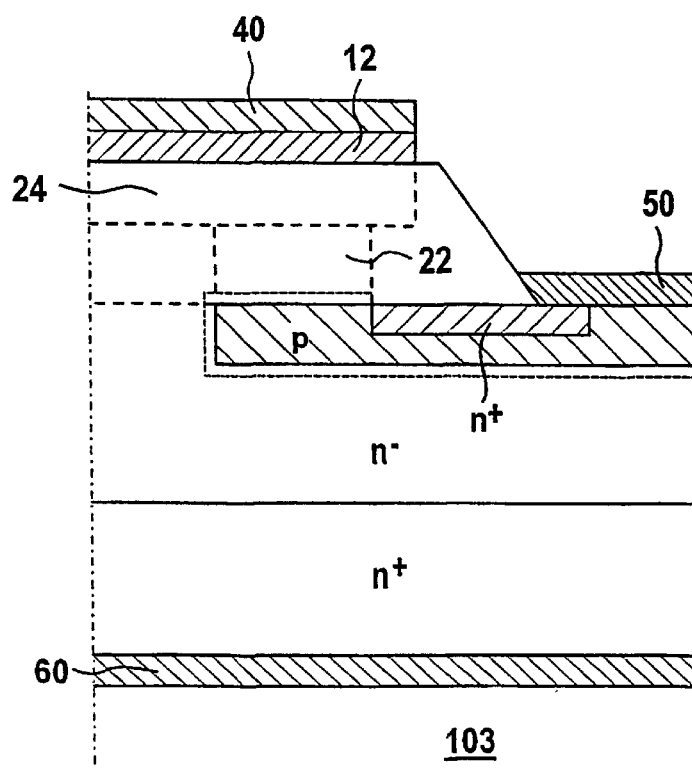

The above-described pinch-off of the lateral channel region 22 can be achieved not only by the current mechanism but also by a control voltage which influences, in particular, the spatial extent of the first depletion zone 24. The exemplary embodiments of FIGS. 3 to 6 relate to such special configurations of the first depletion zone 24 for the control of the channel region 22. The refinements are each illustrated using the example of the semiconductor construction 100 from FIG. 1. All the configurations can also be transferred analogously to the semiconductor construction 101 from FIG. 2. In the exemplary embodiment in accordance with FIG. 3, the first space charge zone 24 is brought about by a Schottky contact. To that end, a control electrode 40 is situated directly on the first surface 20. By the application of a corresponding control voltage to the control electrode 40, the first space charge zone 24 and thus the lateral channel region 22 is influenced in its vertical extent.

If separate influencing of the first depletion zone 24 by a control voltage is not necessary, the control electrode 40 can also be short-circuited to the first electrode 50. This results in a common electrode, not illustrated in FIG. 3. With a possibility for influencing by an external control voltage, an active semiconductor construction 102 is produced. By contrast, a passive semiconductor construction 102 is obtained with a common electrode comprising control electrode 40 and first electrode 50. A suitable material for the common electrode is nickel. In a further semiconductor construction 103 according to FIG. 4, the first depletion zone 24 is brought about by a MOS (Metal Oxide Semiconductor) contact. To that end, an insulation layer 12 in the form of an oxide layer is situated directly on the first surface 20. A control electrode 40 is arranged on said layer and can control, in turn, the first depletion zone 24.

Figure 5:
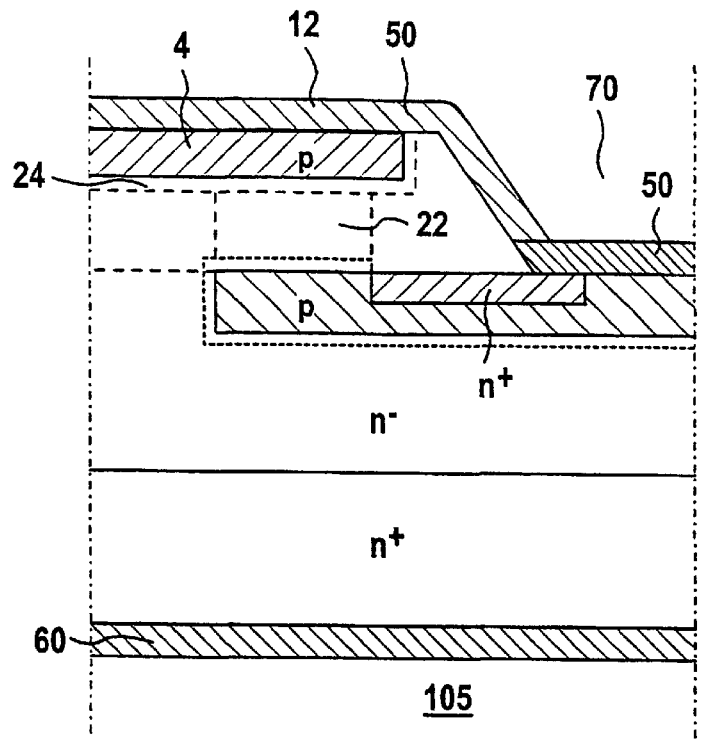
Figure 6:
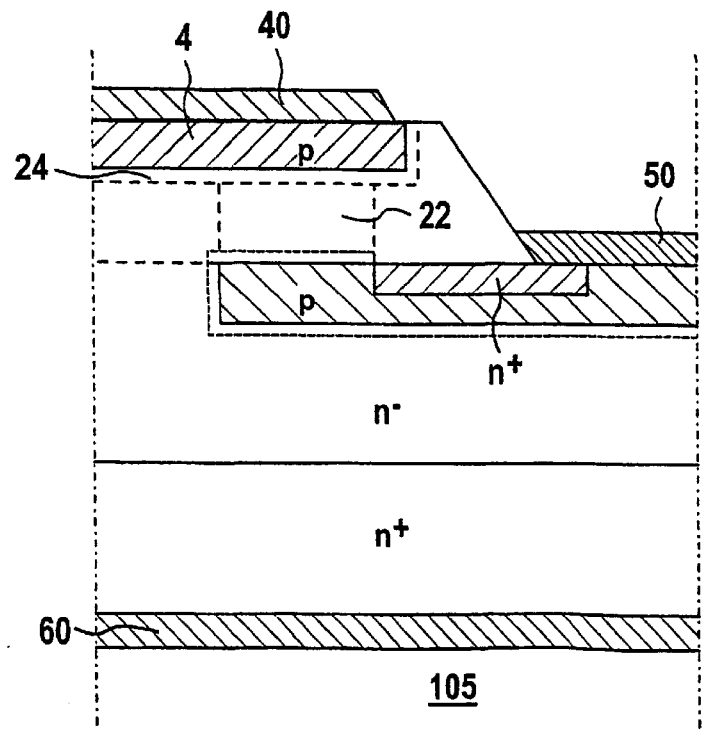

By contrast, FIGS. 5 and 6 illustrate a semiconductor construction 104 and a semiconductor construction 105, respectively, in which a second semiconductor region 4 is in each case arranged at the first surface 20 within the first semiconductor region 2. Said second semiconductor region has the opposite conductivity type, that is to say the p-conductivity type in the exemplary embodiments illustrated, with respect to the conductivity type of the first semiconductor region 2. It is likewise preferably produced by ion implantation. The second semiconductor region 4 is heavily p-doped (p$^+$), in particular. A p-n junction is then present between the first semiconductor region 2 and the second semiconductor region 4, the depletion zone of which p-n junction in this case forms the first depletion zone 24.

In the case of the semiconductor construction 104 according to FIG. 5, a layer extends on the surface 20, which layer extends continuously from the second semiconductor region 4 through to the first electrode 50 within the contact hole 70. In this case, two different embodiments can be distinguished from one another. In the first embodiment, the layer is composed of electrically insulating material, and of conductive material in the second embodiment. In both cases, the result is a passive semiconductor construction 104 which cannot be controlled externally in a targeted manner, for example by application of a control voltage.

In the first embodiment, an insulation layer 12 is arranged on the first surface 20, which insulation layer electrically insulates the second semiconductor region 4 and thus prevents a flowing-away of charges (electrons in the case illustrated) that have diffused from the second semiconductor region 4 into the first depletion zone 24. The leakage current of the insulation layer 12 should be as low as possible in order to ensure good charge storage in the second semiconductor region 4. A further function of the insulation layer 12 is the electrical insulation of the second semiconductor region 4 from the first electrode 50. An oxide, preferably a thermally grown silicon dioxide ($SiO_2$), is used as material for the insulation layer 12. Thermal $SiO_2$ has very good insulation properties and can be produced on SiC by dry or wet oxidation at temperatures in excess of 1000° C.

In the second embodiment of the semiconductor construction 104 from FIG. 5, the first electrode 50 also extends as far as the second semiconductor region 4 and likewise effects ohmic contact-connection thereof. The second semiconductor region 4 and the contact region 5 and also the buried island region 3 are then connected to one another in an electrically conductive, i.e. low-resistance, manner by means of the first electrode 50.

In contrast to the two passive (non-controllable) embodiments of the semiconductor construction 104 in accordance with FIG. 5, an active (controllable) semiconductor construction 105 is illustrated in FIG. 6. To that end, a separate control electrode 40 is provided on the second semiconductor region 4. Thus, by applying a control potential to the control electrode 40, it is possible to alter the extent of the first depletion zone 24 independently of a potential present at the first electrode 50. Consequently, the conductivity of the lateral channel region 22 can be actively controlled in this exemplary embodiment.

An active semiconductor construction, i.e. one that can be influenced by an external control voltage, 102, 103 or 105 can be used particularly advantageously in a cascode circuit comprising a low-voltage switching element with a high-voltage switching element, said cascode circuit being disclosed in DE 196 10 135 C1. In this case, the semiconductor construction 102, 103 or 105 then used forms the high-voltage switching element. This yields an overall circuit which, with an only very low control voltage (of the order of magnitude of a few volts), can be switched from a current-carrying state into a current-blocking state and, at the same time, can reliably take up the operating voltage present in the current-blocking state. The active semiconductor construction 102, 103 or 105 used enables a very robust and, in particular, also very fast changeover from the current-conducting state into the current-blocking state.

We claim:

1. A semiconductor construction for controlling a current, comprising:
    a first semiconductor region of a first conductivity type having a first surface;
    an island region of a second conductivity type, opposite the first conductivity type, at least partly buried within said first semiconductor region and having a second surface facing said first surface;
    a contact region of the first conductivity type disposed at said second surface within said island region; and
    a lateral channel region formed between said first surface and said second surface and forming a part of said first semiconductor region;
        said channel region forming a part of a current path from or to said contact region;
        at least one depletion zone for influencing a current within said channel region; and
        said channel region having one lateral edge reaching to said contact region.

2. The semiconductor construction according to claim 1, wherein said first semiconductor region is formed with at least one contact hole extending from said first surface at least as far as said second surface, and a first electrode within said contact hole forms a common ohmic contact to said island region and said contact region.

3. The semiconductor construction according to claim 1, wherein said second surface is set back in a region of said contact region relative to a region of said island region adjoining said lateral channel region.

4. The semiconductor construction according to claim 1, which comprises a first depletion zone bounding or pinching off said lateral channel region in a vertical direction on a side thereof facing said first surface and a second depletion zone of a p-n junction located between said first semiconductor region and said island region bounding or pinching off said lateral channel region on a side thereof facing said island region.

5. The semiconductor construction according to claim 4, wherein said first depletion zone and said contact region overlap in a projection, perpendicularly to said first surface, into a common plane at lateral edges thereof.

6. The semiconductor construction according to claim 4, wherein said first depletion zone is a part of a Schottky contact.

7. The semiconductor construction according to claim 6, wherein said Schottky contact comprises a control electrode and a region of said first semiconductor region located at said first surface.

8. The semiconductor construction according to claim 7, wherein said control electrode of said Schottky contact and a first electrode form a common electrode to said island region and said contact region.

9. The semiconductor construction according to claim 4, wherein said first depletion zone is part of an MIS contact.

10. The semiconductor construction according to claim 9, wherein said MIS contact comprises a control electrode arranged on an insulation layer on said first surface of said first semiconductor region.

11. The semiconductor construction according to claim 10, wherein said insulation layer is an oxide layer.

12. The semiconductor construction according to claim 4, wherein said first depletion zone forms a part of a p-n junction formed between said first semiconductor region and said second semiconductor region, said first depletion zone having a conductivity type opposite the conductivity type of said first semiconductor region and being disposed at said first surface within said first semiconductor region.

13. The semiconductor construction according to claim 12, wherein said second semiconductor region is electrically insulated at said first surface.

14. The semiconductor construction according to claim 12, which comprises a control electrode ohmically connected to said second semiconductor region for controlling an electrical resistance in said lateral channel region.

15. The semiconductor construction according to claim 14, wherein said control electrode of said second semiconductor region and said first electrode of said contact region and of said island region are formed as a common electrode.

16. The semiconductor construction according to claim 1, which comprises an electrode on a side of said first semiconductor region opposite said first surface.

17. The semiconductor construction according to claim 16, wherein a p-n junction is formed between said first semiconductor region and said electrode.

18. The semiconductor construction according to claim 1 formed with silicon carbide as semiconductor material.

* * * * *